(12) United States Patent
Jacob

(10) Patent No.: US 9,748,387 B2
(45) Date of Patent: Aug. 29, 2017

(54) METHODS OF FORMING PMOS FINFET DEVICES AND MULTIPLE NMOS FINFET DEVICES WITH DIFFERENT PERFORMANCE CHARACTERISTICS

(71) Applicant: GLOBALFOUNDRIES Inc., Grand Cayman (KY)

(72) Inventor: Ajey Poovannummoottil Jacob, Watervliet, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/940,655

(22) Filed: Nov. 13, 2015

(65) Prior Publication Data

US 2017/0141227 A1    May 18, 2017

(51) Int. Cl.
*H01L 29/165* (2006.01)
*H01L 29/78* (2006.01)
*H01L 21/8238* (2006.01)

(52) U.S. Cl.
CPC .. *H01L 29/7848* (2013.01); *H01L 21/823807* (2013.01); *H01L 21/823821* (2013.01); *H01L 21/823878* (2013.01)

(58) Field of Classification Search
CPC ........... H01L 29/66795; H01L 27/0924; H01L 21/823821
See application file for complete search history.

(56) References Cited

U.S. PATENT DOCUMENTS

| 2007/0090416 | A1  | 4/2007 | Doyle et al. |
| 2016/0043225 | A1* | 2/2016 | Ching ................. H01L 29/1054 257/401 |
| 2016/0190319 | A1* | 6/2016 | Kavalieros ............. H01L 29/78 257/190 |
| 2016/0276347 | A1* | 9/2016 | Cea ................... H01L 29/66795 |

OTHER PUBLICATIONS

Paul, "Silicon-Germanium Strained Layer Materials in Microelectronics," Advanced Materials, 11:191-204, 1999.
Office Action from related U.S. Appl. No. 14/940,597 dated Oct. 19, 2016.

* cited by examiner

*Primary Examiner* — Julia Slutsker
(74) *Attorney, Agent, or Firm* — Amerson Law Firm, PLLC

(57) ABSTRACT

One method disclosed includes forming first, second and third fins for a first NMOS device, a PMOS device and a second NMOS device, respectively. According to this method, the first fin consists entirely of the substrate material, the second and third fins comprise a lower substrate fin portion made of the substrate material and an upper fin portion made of a second semiconductor material and a third semiconductor material, respectively, wherein the second semiconductor material and the third semiconductor material are each different from the substrate material. The method also includes forming a semiconductor material cladding on the exposed upper portion of the third fin for the second NMOS FinFET device.

24 Claims, 14 Drawing Sheets

METHODS OF FORMING PMOS FINFET DEVICES AND MULTIPLE NMOS FINFET DEVICES WITH DIFFERENT PERFORMANCE CHARACTERISTICS

BACKGROUND OF THE INVENTION

1. Field of the Invention

Generally, the present disclosure relates to the manufacture of FET semiconductor devices, and, more specifically, to various methods of forming PMOS FinFET devices and multiple NMOS FinFET devices with different structural configurations and different performance characteristics.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each transistor device comprises laterally spaced apart drain and source regions that are formed in a semiconductor substrate, a gate electrode structure positioned above the substrate and between the source/drain regions, and a gate insulation layer positioned between the gate electrode and the substrate. Upon application of an appropriate control voltage to the gate electrode, a conductive channel region forms between the drain region and the source region and current flows from the source region to the drain region.

A conventional FET is a planar device wherein the entire channel region of the device is formed parallel and slightly below the planar upper surface of the semiconducting substrate. To improve the operating speed of planar FETs, and to increase the density of planar FETs on an integrated circuit product, device designers have greatly reduced the physical size of planar FETs over the past decades. More specifically, the channel length of planar FETs has been significantly decreased, which has resulted in improving the switching speed and in lowering operation currents and voltages of planar FETs. However, decreasing the channel length of a planar FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the planar FET as an active switch is degraded.

In contrast to a planar FET, there are so-called 3D devices, such as an illustrative FinFET device, which is a three-dimensional structure. FIG. 1A is a perspective view of an illustrative prior art FinFET semiconductor device 10 that is formed above a semiconductor substrate 12 wherein the fins 14 of the device 10 are made of the material of the substrate 12, e.g., silicon. The device 10 includes a plurality of trenches 13, three illustrative fins 14, a gate structure 16, a sidewall spacer 18 and a gate cap layer 20. An isolation material 17 provides electrical isolation between the fins 14.

The gate structure 16 is typically comprised of a layer of insulating material (not separately shown), e.g., a layer of high-k insulating material, and one or more conductive material layers that serve as the gate electrode for the device 10. The fins 14 have a three dimensional configuration: a height H, a width W and an axial length L. The axial length L corresponds to the direction of current travel in the device 10 when it is operational. The portions of the fins 14 covered by the gate structure 16 are the channel regions of the FinFET device 10. The portions of the fins 14 that are positioned outside of the spacers 18 will become part of the source/drain regions of the device 10.

In the FinFET device 10, the gate structure 16 encloses both sides and the upper surface of the fins 14 to form a tri-gate structure so as to use a channel having a three-dimensional structure instead of a planar structure. In some cases, an insulating cap layer, e.g., silicon nitride, is positioned at the top of the fins 14 and the FinFET device only has a dual-gate structure (sidewalls only). Unlike a planar FET, in a FinFET device, a channel is formed perpendicular to a surface of the semiconducting substrate so as to increase the drive current per footprint of the device. Also, in a FinFET, the improved gate control through multiple gates on a narrow, fully-depleted semiconductor fin significantly reduces the short channel effects. When an appropriate voltage is applied to the gate electrode 16 of a FinFET device 10, the surfaces (and the inner portion near the surface) of the fins 14, i.e., the vertically oriented sidewalls and the top upper surface of the fin, form a surface inversion layer or a volume inversion layer that contributes to current conduction. Accordingly, for a given plot space (or footprint), FinFETs tend to be able to generate significantly higher drive current than planar transistor devices. Additionally, the leakage current of FinFET devices after the device is turned "OFF" is significantly reduced as compared to the leakage current of planar FETs, due to the superior gate electrostatic control of the "fin" channel on FinFET devices. In short, the 3D structure of a FinFET device is a superior MOSFET structure as compared to that of a planar FET, especially in the 20 nm CMOS technology node and beyond.

Device manufacturers are under constant pressure to produce integrated circuit products with increased performance and lower production costs relative to previous device generations. Thus, device designers spend a great amount of time and effort to maximize device performance while seeking ways to reduce manufacturing costs and improve manufacturing reliability. As it relates to 3D devices, device designers have spent many years and employed a variety of techniques in an effort to improve the performance, capability and reliability of such devices. Device designers are currently investigating alternative semiconductor materials, such as SiGe, Ge and III-V materials, to manufacture FinFET devices, which are intended to enhance the performance capabilities of such devices, e.g., to enable low-voltage operation without degrading their operating speed.

FIG. 1B is a perspective view of an illustrative prior art FinFET semiconductor device 10, wherein the overall fin structure of the device includes a substrate fin portion 14A and an alternative fin material portion 14B. As with the case above, the substrate fin portion 14A may be made of silicon, i.e., the same material as the substrate, and the alternative fin material portion 14B may be made of a material other than the substrate material, for example, silicon-germanium, substantially pure germanium, III-V materials, etc. As noted above, the use of such alternative fin materials improves the mobility of charge carriers in the device.

However, the integration of such alternative materials on silicon substrates (the dominant substrates used in the industry) is non-trivial due to, among other issues, the large difference in lattice constants between such alternative materials and silicon. That is, with reference to FIG. 1B, the lattice constant of the alternative fin material portion 14B of the fin 14 may be substantially greater than the lattice constant of the substrate fin portion 14A of the fin 14. As a result of this mismatch in lattice constants, an unacceptable number of defects may be formed or created in the alternative fin material portion 14B. As used herein, a "defect" essentially refers to a misfit dislocation at the interface between the portions 14A and 14B of the fin 14 or threading dislocations that propagate through the portion 14B on the fin 14 at well-defined angles.

With respect to forming such lattice-constant-mismatched materials on one another, there is a concept that is generally referred to as the "critical thickness" of a material. The term "critical thickness" generally refers to materials that are in one of three conditions, i.e., so-called "stable," "metastable" or "relaxed-with-defects" conditions. These three conditions also generally reflect the state of the strain on the material. That is, a stable material is in a fully-strained condition that is 100% strained in at least one crystalline plane of the material, a relaxed-with-defects material is a material that has zero strain in all crystalline planes, and a metastable material is strained to a level that is above zero strain but less than 100% strained in at least one crystalline plane of the metastable material. In general, a fully-strained (stable) material or a partially-strained (metastable) material will have fewer defects than a fully relaxed, unstrained material.

FIG. 1C is a graph taken from an article entitled "Silicon-Germanium Strained Layer Materials in Microelectronics" by Douglas J. Paul that was published in *Advanced Materials* magazine (11(3), 101-204 (1999)). FIG. 1C graphically depicts these three conditions for silicon germanium materials ($Si_{1-x}Ge_x$; x=0-1). The vertical axis is the critical thickness in nanometers. The horizontal axis is the concentration of germanium in the silicon germanium material. At the leftmost point on the horizontal axis is pure silicon (Ge concentration equals 0.0). At the rightmost point on the horizontal axis is pure germanium (Ge concentration equals 1.0). The two curves R and S define the stable, metastable and relaxed-with-defects regions for silicon germanium materials having differing germanium concentration levels. Above and to the right of curve R are materials that are in a relaxed condition with defects present in the material. Below and to the left of the curve S are materials that are in the stable or fully strained condition where there are little or no defects present in the material. The region between the two curves R and S defines the region where materials are in the metastable condition. The graph reflects the critical thickness of various materials when they are grown in an unconfined growth environment, e.g., when growing a substantially planar alternative semiconductor film or layer on the entire upper surface of a silicon substrate.

To add more precision to the terminology regarding critical thickness, the term "stable critical thickness" will be used herein and in the attached claims to refer to a maximum thickness of a material at which it may be formed in a substantially defect-free and "fully-strained" condition above a substrate material in an unconfined growth environment. Additionally, as used herein and in the attached claims, the term "metastable critical thickness" will be used to refer to a maximum thickness of a material at which it may be formed in a metastable condition above a substrate material, i.e., in an unconfined growth environment. As noted above, a material that is in the metastable condition is a material that has experienced some degree of strain-relaxation, but still remains strained to some degree (i.e., 1-99% strained but not 100% strained) in one crystalline plane of the metastable material such that defects are not typically formed in the metastable material itself. However, a metastable material may or may not have some amount of defects at the interface between the alternative material and a silicon substrate depending upon the amount of strain relaxation that has happened to the material.

With reference to FIG. 1C, a layer of pure germanium (Ge concentration equal to 1.0) may be in the stable and fully strained condition at a thickness up to about 1-2 nm (point CT1) and it may be in a metastable condition for thicknesses between about 2-4 nm (point CT2). Above a thickness of about 4 nm, a layer of pure germanium will be in the relaxed-with-defects condition. In contrast, a layer of silicon germanium with a 50% concentration of germanium may be in the stable and fully strained condition at thicknesses up to about 4 nm (point CT3) and it may be in a metastable condition for thicknesses between about 4-30 nm (point CT4). Above a thickness of about 30 nm, a layer of silicon germanium with a 50% concentration of germanium will be in the relaxed-with-defects condition. A material that is in the relaxed-with-defects condition is a material that contains visible defects that are indicative that the material has relaxed to the point where defects have been formed in the material.

As another example, a substantially pure layer of germanium (Ge concentration equal to 1.0) may have a maximum stable critical thickness of about 1-2 nm when formed on a silicon substrate, i.e., in an unconfined growth environment. A substantially pure layer of germanium formed to a thickness of 1-2 nm or less would be considered to be a stable, fully-strained layer of germanium. In contrast, a layer of silicon germanium with a concentration of germanium of about fifty percent ($SiGe_{0.5}$) may have a maximum stable critical thickness of about 4 nm and still be substantially free of defects, i.e., in a stable condition. However, such a layer of germanium or silicon germanium would no longer be considered to be a stable material if grown beyond their respective maximum stable critical thickness values. When such a layer of material is grown to a thickness that is greater than its maximum stable critical thickness but less than its maximum metastable thickness, it is considered to be a metastable material that would start experiencing some degree of relaxation, i.e., there will be some degree of strain relaxation along one or more of the crystalline planes of the material and there may or may not be some defects present at or near the interface between the alternative fin material and the substrate fin. Thus, in general, the formation of stable, fully-strained, substantially defect-free alternative materials on silicon is limited to very thin layers of the alternative materials.

One of the proposed approaches for the formation of alternative materials for FinFET devices will now be discussed with reference to FIGS. 1D-1H, which are cross-sectional views of the fins taken in a gate width direction of the device 10. As shown in FIG. 1D, the initial fin structures 14 are formed in the substrate 12 by performing an etching process through a patterned etch mask 15. FIG. 1E depicts the device 10 after the layer of insulating material 17 was deposited in the trenches 13 and one or more chemical mechanical polishing (CMP) processes were performed to remove the etch mask 15 and excess amounts of the layer of insulating material 17. These operations expose the upper surface of the fins 14. Next, as shown in FIG. 1F, a timed recessing etching process was performed to remove a portion of the initial fins 14 (now denoted as fins 14A) such that they have a recessed upper surface 14R. Thereafter, as shown in FIG. 1G, the alternative fin material 14B is grown on the recessed fin structures by performing a selective epitaxial deposition process. FIG. 1H depicts the device after a recess etching process was performed on the layer of insulating material 17 such that it has a recessed upper surface 17R that exposes the desired amount of the alternative fin material 14B. At the point of processing depicted in FIG. 1H, traditional manufacturing processes are then performed to form the gate structure 16, gate cap layer 20 and sidewall spacers 18.

Another prior art technique for forming fins made of alternative semiconductor materials involves the formation of one or more so-called SRB (strained relaxed buffer) layers on the silicon substrate (prior to fin-formation) or on the recessed silicon fins prior to formation of the channel semiconductor material, such as a material containing a high concentration of germanium or substantially pure germanium. For example, a germanium channel material formed on an SRB layer having a relatively low percentage of germanium, e.g., 25% or less, can provide substantial band offset isolation for PMOS devices. However, band offset isolation is not possible for an NMOS device using the same SRB layer due to the different nature and composition of an NMOS device and a PMOS device. This is problematic for many integrated circuit products that are manufactured using CMOS technology, i.e., using both NMOS and PMOS devices. The formation of separate SRB layers for NMOS and PMOS devices would increase processing complexity and costs.

It is also known in the prior art to form semiconductor material cladding on the fin of a FinFET device. FIG. 1I is a cross-sectional view of a FinFET 30 device taken through the gate structure 32 in a gate width direction of the device 30. Also depicted are a semiconductor substrate 31, a fin 33, a recessed layer of insulating material 35 and a gate cap layer 39. The gate structure 32 is typically comprised of a layer of gate insulating material 30A, e.g., a layer of high-k insulating material (k-value of 10 or greater) or silicon dioxide, and one or more conductive material layers (e.g., metal, metal alloy, metal stack and/or polysilicon) that serve as the gate electrode 30B for the device 30. In the device 30, the cladding material 34 is the primary current carrying portion of the channel region when the device 30 is operational. Typically, with respect to current day technology, the cladding material 34 may have a thickness of about 2-3 nm. The cladding material 34 is typically an epi semiconductor material, such as silicon germanium, that is formed on the fin 33 by performing known epi deposition processes.

One process flow that is typically performed to form the illustrative FinFET device 30 with the cladding material 34 positioned on the fin 33 is as follows. First, a plurality of trenches 37 were formed in the substrate 31 to define the initial fins 33 (only one fin is shown in FIG. 1I). After the trenches 37 are formed, a layer of insulating material 35, such as silicon dioxide, was formed so as to overfill the trenches 37. Thereafter, a CMP process was performed to planarize the upper surface of the insulating material 35 with the top of the fins 33 (or the top of a patterned hard mask). Thereafter, a recess etching process was performed to recess the layer of insulating material 35 between adjacent fins 33 so as to thereby expose the upper portion of the fin 33. At this point, an epitaxial deposition process was performed to form the cladding material 34 on the exposed portion of the fin 33. Additional steps are then performed to complete the fabrication of the device, i.e., gate formation, sidewall spacer formation, epi material growth in the source/drain regions of the device, etc.

The present disclosure is directed to various methods of forming PMOS FinFET devices and multiple NMOS FinFET devices with different structural configurations and different performance characteristics that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming PMOS FinFET devices and multiple NMOS FinFET devices with different structural configurations and different performance characteristics. One illustrative method disclosed herein includes, among other things, forming first, second and third fins for a first NMOS FinFET device, a PMOS FinFET device and a second NMOS FinFET device, respectively. According to this method, the first fin consists entirely of the substrate material, the second and third fins comprise a lower substrate fin portion made of the substrate material and an upper fin portion made of a second semiconductor material and a third semiconductor material, respectively, wherein the second semiconductor material and the third semiconductor material are each different from the substrate material. The method also includes exposing at least a portion of the first fin and at least a portion of the upper fin portion of both of the second and third fins, masking the first NMOS FinFET device and the PMOS FinFET device and forming a semiconductor material cladding on the exposed upper portion of the third fin for the second NMOS FinFET device, wherein the semiconductor material cladding is a different semiconductor material than that of the third semiconductor material. The method also includes forming a gate structure for the PMOS FinFET device and gate structures for the first and second NMOS FinFET devices.

One illustrative integrated circuit product disclosed herein includes, among other things, a semiconductor substrate made of a first semiconductor material, a first NMOS FinFET device comprising a first fin that consists entirely of the first semiconductor material, a first gate insulation layer positioned on and in contact with an upper portion of the first fin and a first NMOS gate structure for the first NMOS FinFET device positioned around the first gate insulation layer. The product also includes a PMOS FinFET device that comprises a second fin comprising a lower substrate fin portion made of the first semiconductor material and an upper fin portion made of a second semiconductor material, wherein the second semiconductor material is different from the first semiconductor material, and a PMOS gate structure positioned around at least a portion of the upper portion of the second fin. In this example, the product also includes a second NMOS FinFET device that is comprised of a third fin comprising a lower substrate fin portion made of the first semiconductor material and an upper fin portion made of a third semiconductor material, wherein the third semiconductor material is different from the first semiconductor material, a semiconductor material cladding positioned on at least a portion of the upper portion of the third fin, wherein the semiconductor material cladding is a different semiconductor material than that of the third semiconductor material, a second gate insulation layer positioned on and in contact with the semiconductor material cladding and a second NMOS gate structure for the second NMOS FinFET device positioned around the second gate insulation layer.

BRIEF DESCRIPTION OF THE DRAWINGS

The disclosure may be understood by reference to the following description taken in conjunction with the accompanying drawings, in which like reference numerals identify like elements, and in which.

Figure 1A:
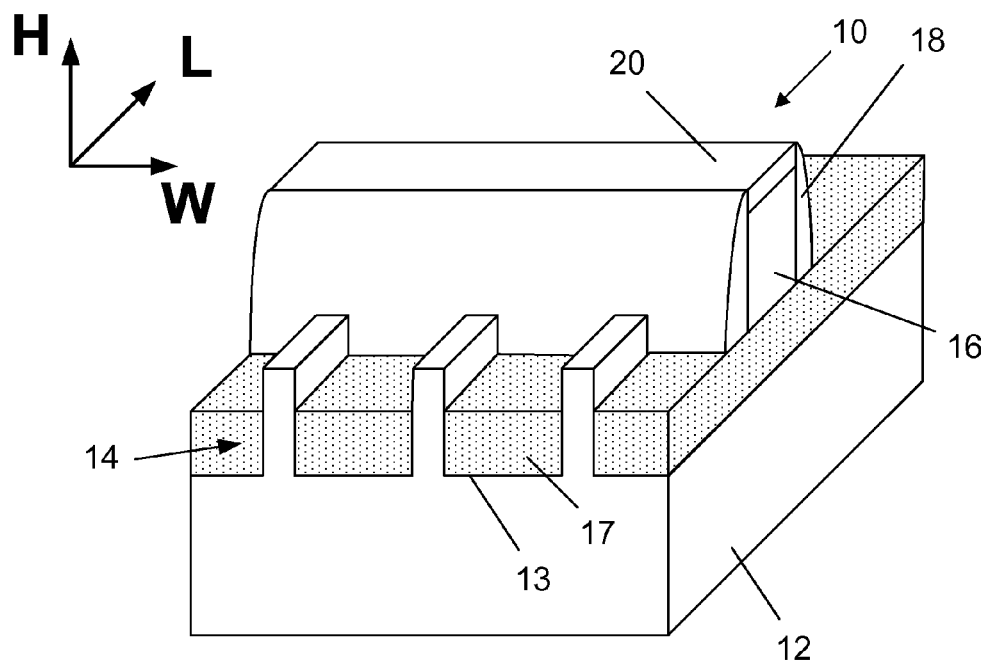
FIG. 1A depicts an example of prior art FinFET devices wherein the fins for the device are comprised of the substrate material.
Figure 1B:
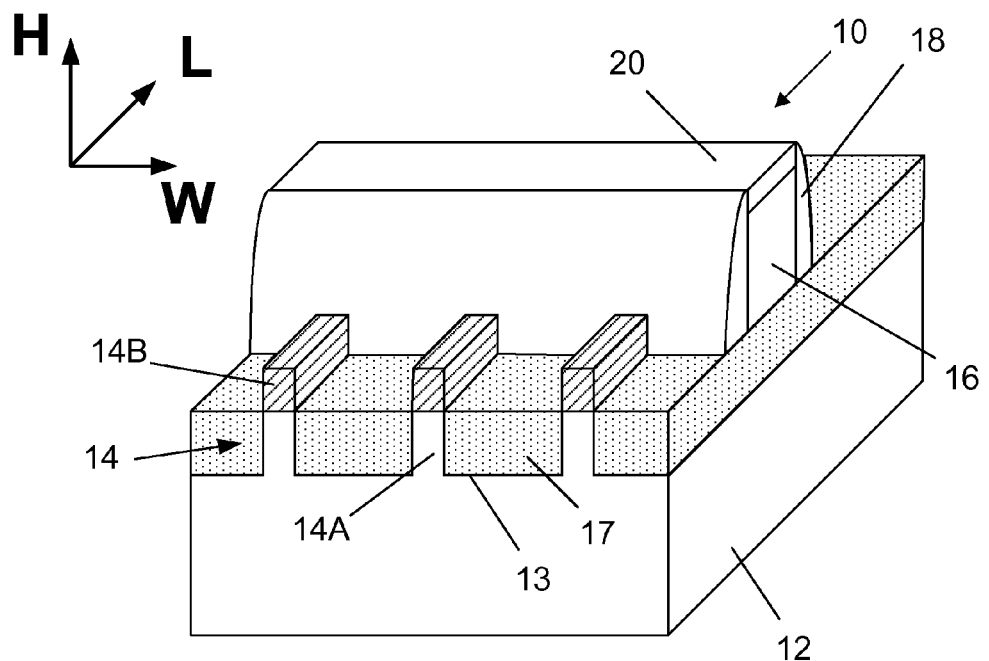
FIG. 1B depicts an example of prior art FinFET devices wherein the fins for the device are comprised of an alternative fin material formed above a substrate fin.
Figure 1C:
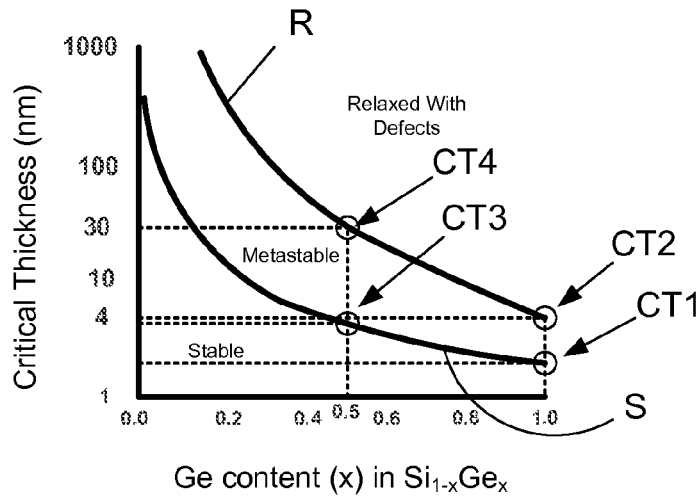
FIG. 1C is an illustrative example of a graph that depicts the condition of alternative materials when formed in an unconfined growth environment.
Figure 1D:
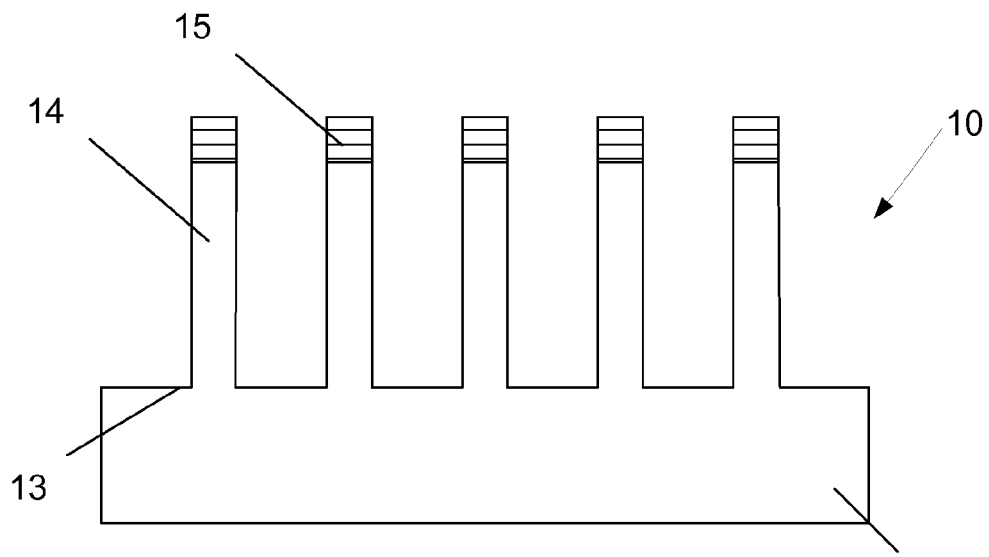
FIGS. 1D-1H depict one illustrative prior art process flow for forming alternative fin materials on FinFET devices.
Figure 1E:
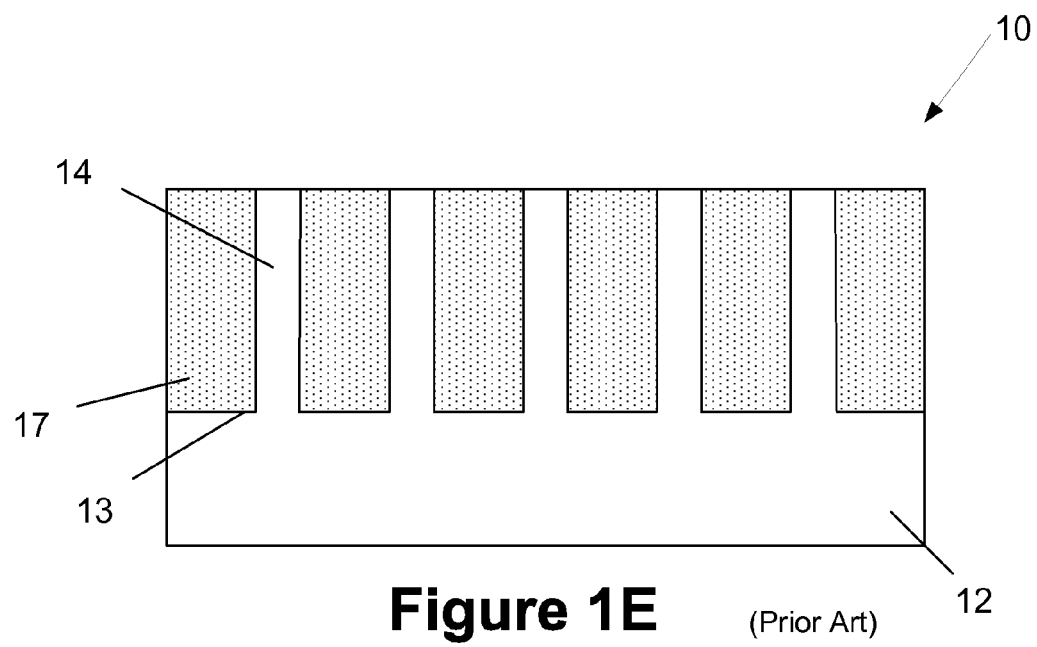
Figure 1F:
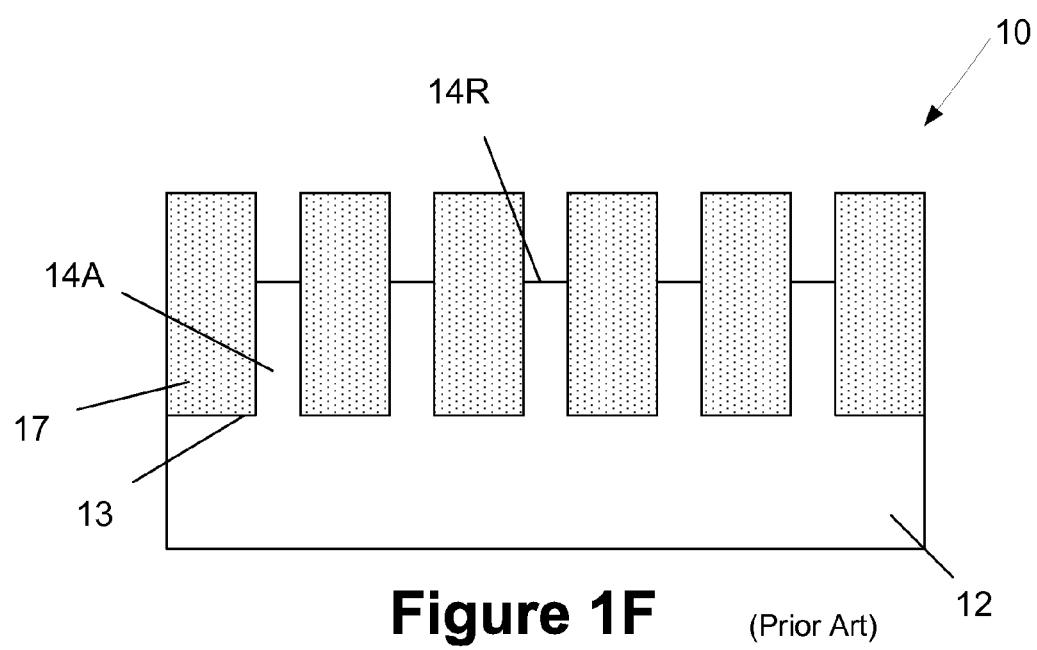
Figure 1G:
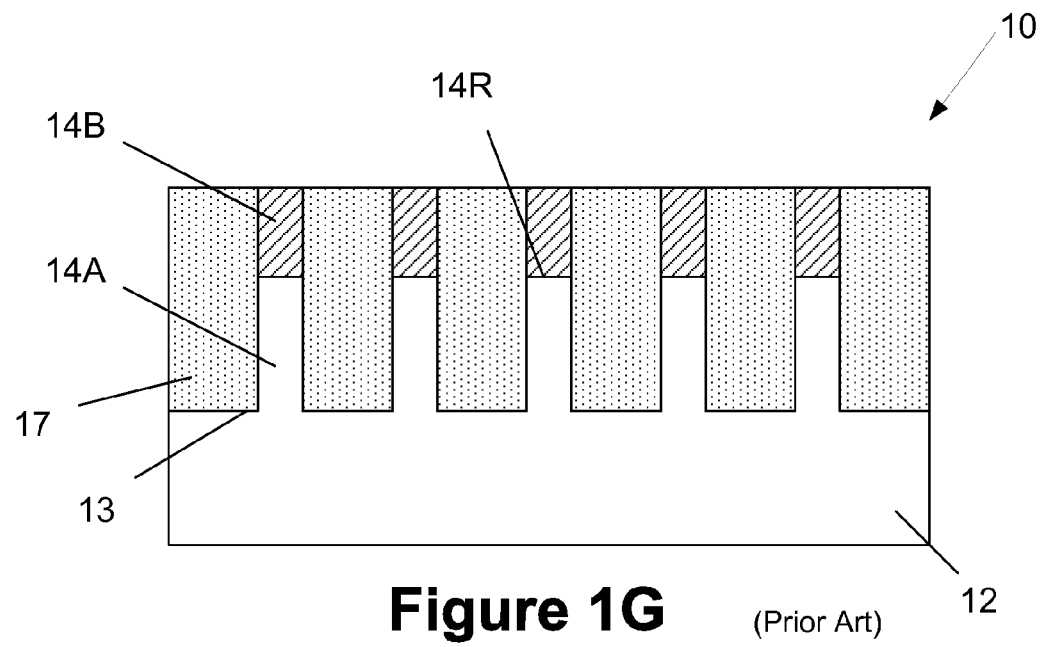
Figure 1H:
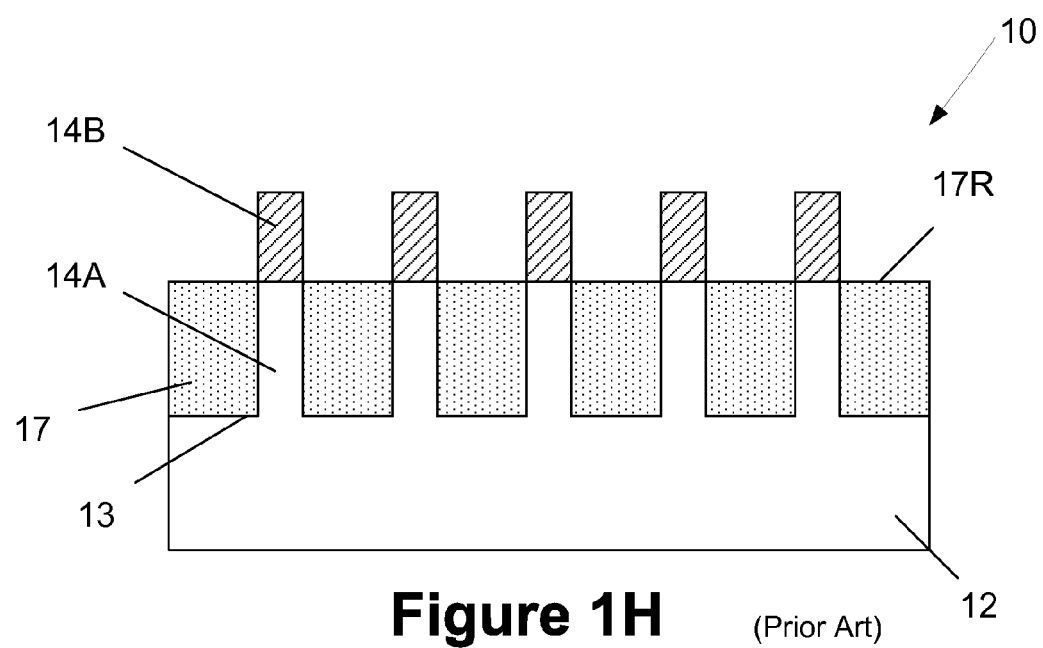
Figure 1I:
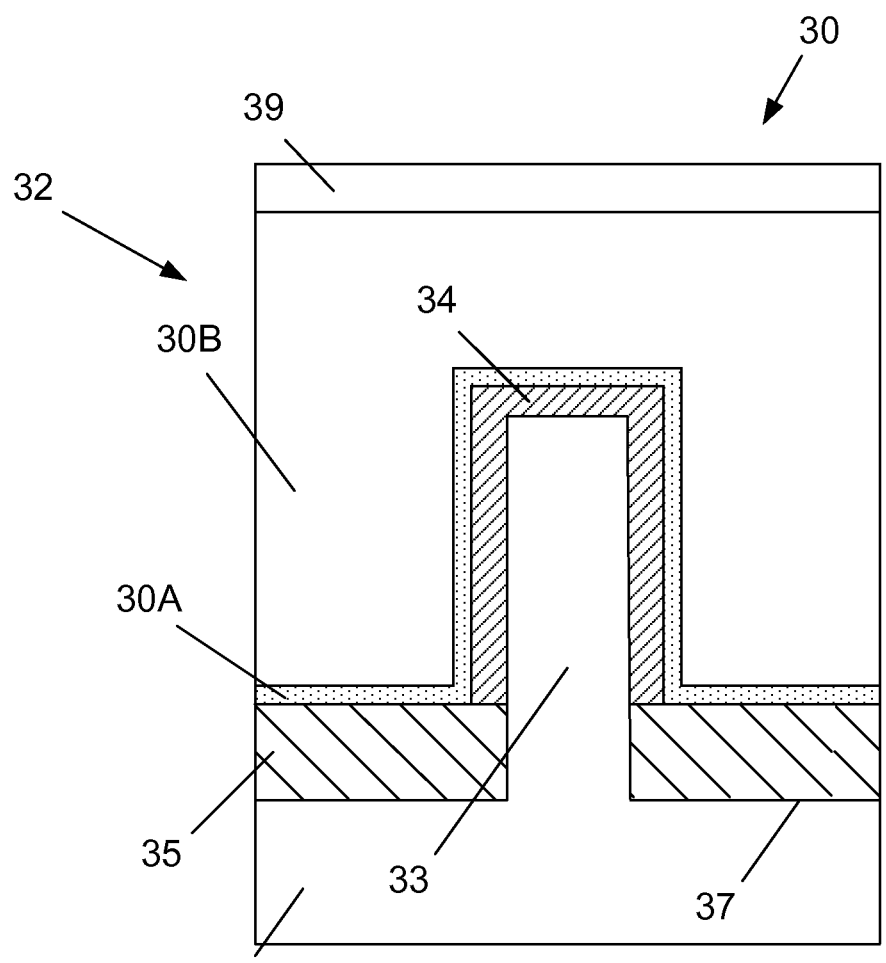
FIG. 1I depicts one illustrative process flow for forming a semiconductor material cladding on a fin for a FinFET device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The methods disclosed herein may be employed in manufacturing N-type devices and P-type devices, and the gate structure of such devices may be formed using either so-called "gate-first" or "replacement gate" ("gate-last" or "gate-metal-last") techniques. As will be readily apparent to those skilled in the art upon a complete reading of the present application, the present method is applicable to a variety of devices, including, but not limited to, logic devices, memory devices, etc. With reference to the attached figures, various illustrative embodiments of the methods and devices disclosed herein will now be described in more detail.

Figure 2A:
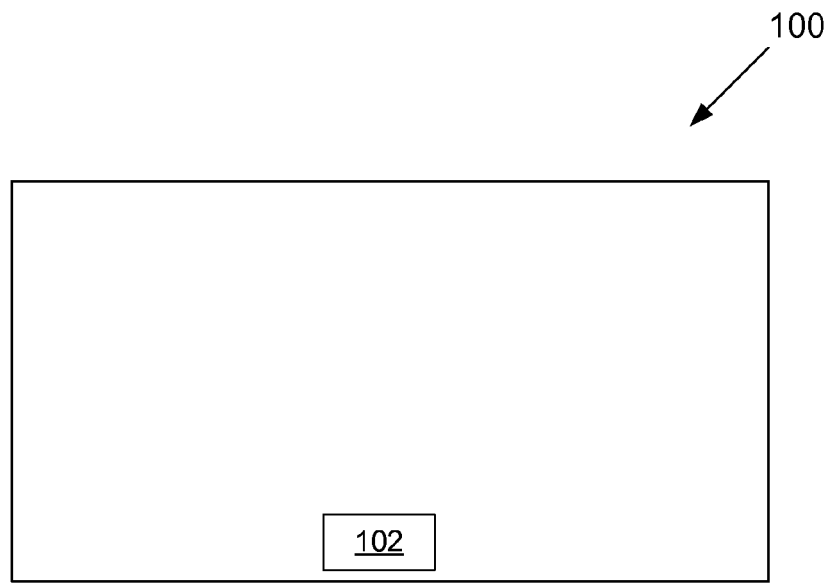
FIGS. 2A-2H depict various illustrative novel methods disclosed herein for forming PMOS and NMOS FinFET devices on CMOS based integrated circuit products.

FIGS. 2A-2H depict various illustrative novel methods of forming PMOS and NMOS FinFET devices on CMOS based integrated circuit products. Of course, the integrated circuit depicted herein may also include other types of FET devices, such as planar FETs. With reference to FIG. 2A, the product 100 depicted herein will be formed above a semiconductor substrate 102 comprised of a semiconductor material, such as, for example, a bulk silicon substrate. Thus, the terms "substrate," "semiconductor substrate" or "semiconducting substrate" should be understood to cover all semiconductor materials.

Figure 2B:
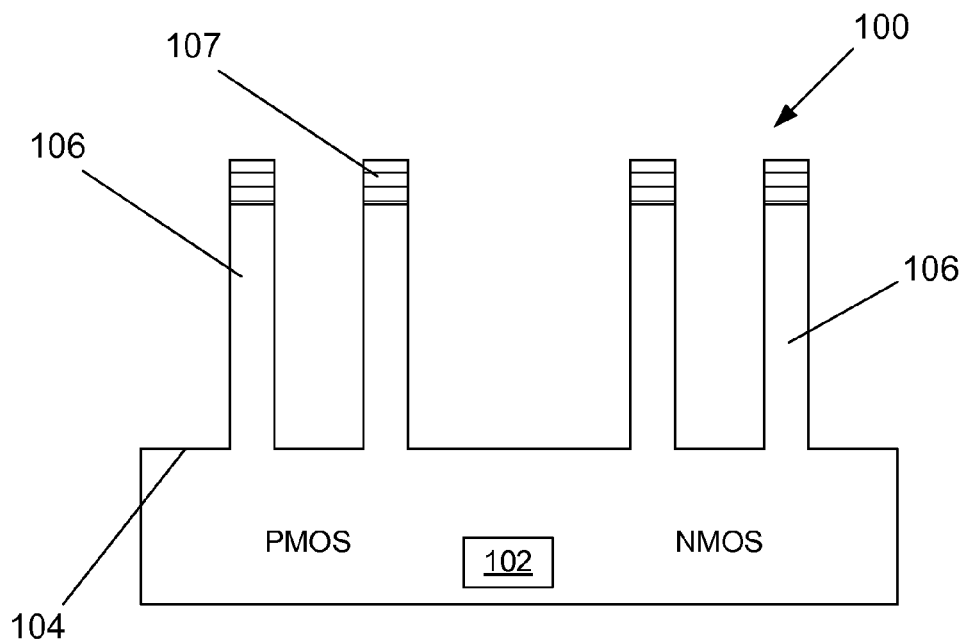

FIG. 2B depicts the product 100 after one or more etching processes, e.g., anisotropic etching processes, were performed through a patterned fin-formation etch mask 107 to form a plurality of fin-formation trenches 104 and thereby define a plurality of overall fin structures 106. The width and height of the overall fin structures 106 may vary depending upon the particular application. Additionally, the overall size, shape and configuration of the fin-formation trenches 104 and overall fin structures 106 may vary depending on the particular application.

In the illustrative examples depicted in the attached drawings, the fin-formation trenches 104 and the fins 106 are all depicted as having a uniform size and shape. However, such uniformity in the size and shape of the trenches 104 and the fins 106 is not required to practice at least some aspects of the inventions disclosed herein. In the attached figures, the fin-formation trenches 104 are depicted as having been formed by performing an anisotropic etching process that results in the overall fin structures 106 having a schematically (and simplistically) depicted, generally rectangular configuration. In an actual real-world device, the sidewalls of the fins 106 may be somewhat outwardly tapered (i.e., the fins may be wider at the bottom of the fin than they are at the top of the fin) although that configuration is not depicted in the attached drawings. Thus, the size and configuration of the trenches 104 and the fins 106, and the manner in which they are made, should not be considered a limitation of the present invention. For ease of disclosure, only the substantially rectangular trenches 104 and fins 106 will be depicted in the subsequent drawings. Moreover, the product 100 may be formed with any desired number of fins 106. In the example depicted herein, the product 100 will be comprised of an NMOS device and a PMOS device, as depicted in FIG. 2B, each of which is comprised of two of the illustrative fins 106 at this point in the process flow.

Figure 2C:
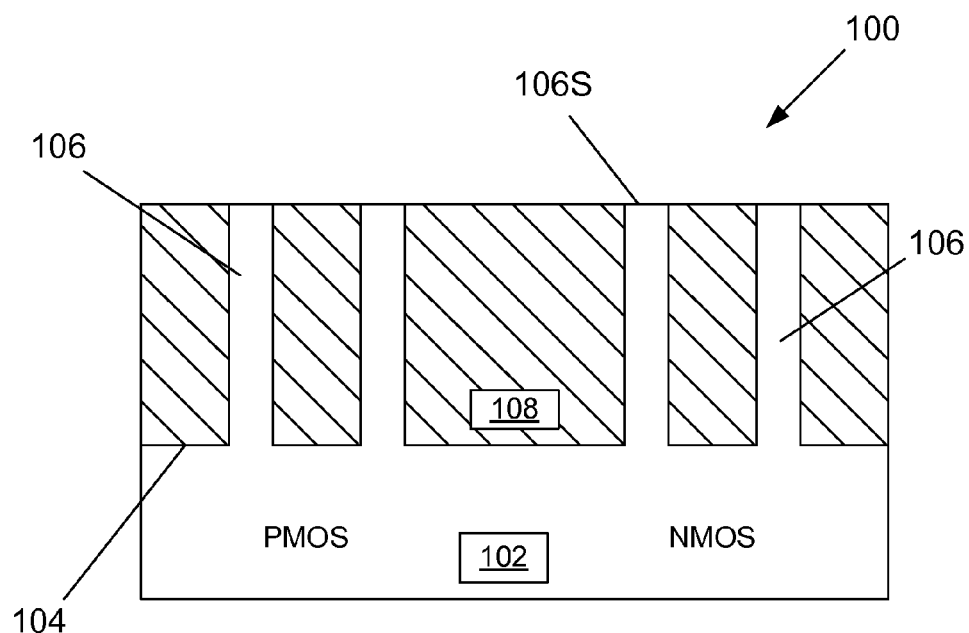

FIG. 2C depicts the product 100 after a layer of insulating material 108 (e.g., silicon dioxide) was deposited so as to overfill the fin-formation trenches 104 and after at least one process operation, such as an optional CMP process, was performed to planarize the upper surface of the layer of insulating material 108 and thereby expose the upper surface 106S of the fins 106. In some embodiments, rather than remove the patterned mask layer 107 prior to the formation of the layer of insulating material 108, the layer of insulating material 108 may be deposited so as to overfill the trenches 104 and the patterned mask layer. Thereafter, one or more CMP processes may be performed to remove the patterned mask layer 107 and portions of the layer of insulating material 108, stopping on the upper surface 106S of the fins 106.

Figure 2D:
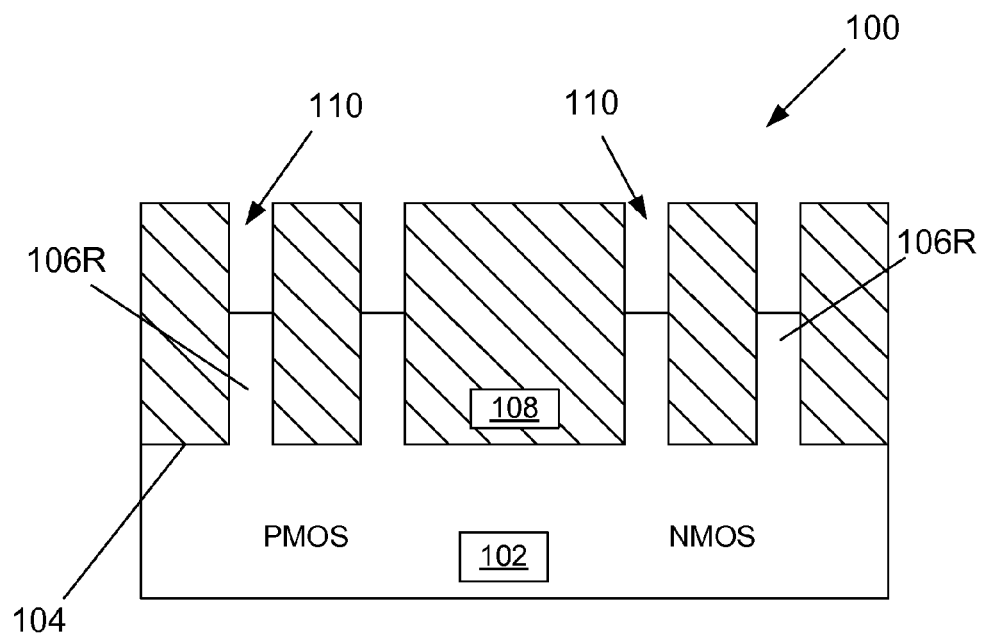

FIG. 2D depicts the product 100 after a timed, recess etching process was performed to remove a portion of the fins 106 for both of the devices and to thereby define a plurality of replacement fin cavities 110 above the remaining portions of the fins 106R, which will become the lower substrate portion of the completed fins for the two devices. The depth of the fin cavities 110 may vary depending upon the particular application. In general, the depth of the fin cavities 110 should be shallow enough such that a fully-strained, substantially defect free semiconductor material 112 (described below) may be formed in the fin cavities 110, e.g., about 30-50 nm. The semiconductor material 112 may be comprised of a semiconductor material that is different from that of the substrate material 102. For example, if the substrate 102 is made of silicon, the semiconductor material 112 may be made of silicon germanium ($Si_{(1-x)}Ge_x$ where "x" ranges from 0.1-1), such as $Si_{0.75}Ge_{0.25}$ or $Si_{0.50}Ge_{0.5}$, substantially pure germanium, a III-V material, etc. The semiconductor material 112 may be formed by performing an epitaxial growth process, and it may have a thickness that corresponds approximately to the depth of the fin cavities 110. As will be appreciated by those skilled in the art after a complete reading of the present application, the semiconductor material 112 will become the channel semiconductor material for the PMOS device.

Figure 2E:
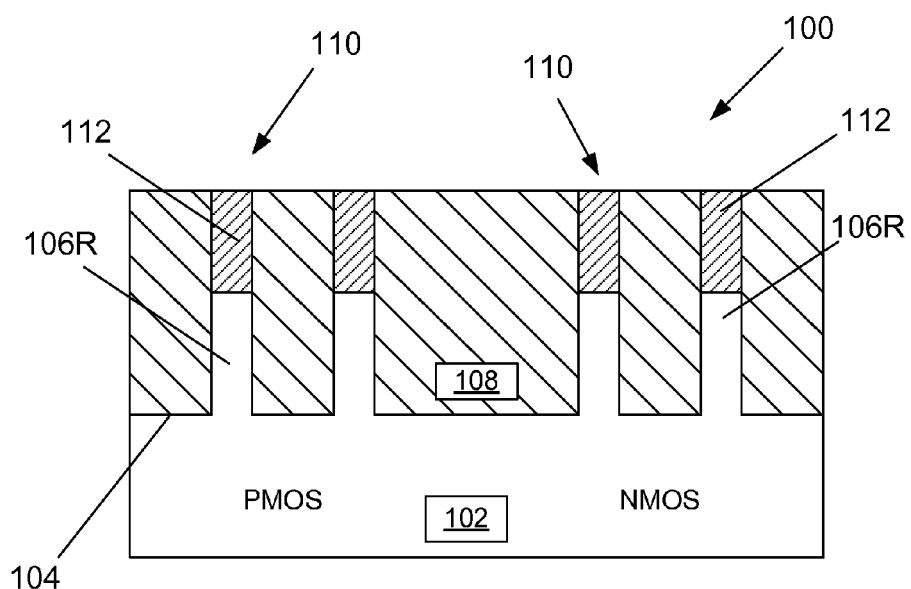

FIG. 2E depicts the product 100 after the semiconductor material 112 was formed on the recessed upper surface of the remaining portions of the fins 106R in the fin cavities 110 by performing an epitaxial deposition process. As noted above, in one illustrative embodiment, the semiconductor material 112 may be a fully-strained, substantially defect-free substantially pure germanium material or a silicon-germanium material. In one embodiment, the growth of the semiconductor material 112 may be controlled such that it remains entirely within the replacement fin cavities 110. In other embodiments, the semiconductor material 112 may be formed such that it overfills the replacement fin cavities 110. In such a situation, a CMP process may be performed to remove excess amounts of the semiconductor material 112 positioned outside of the replacement fin cavities 110. If desired, the semiconductor material 112 may be formed with a compressive stress to enhance the performance of the PMOS device.

Figure 2F:
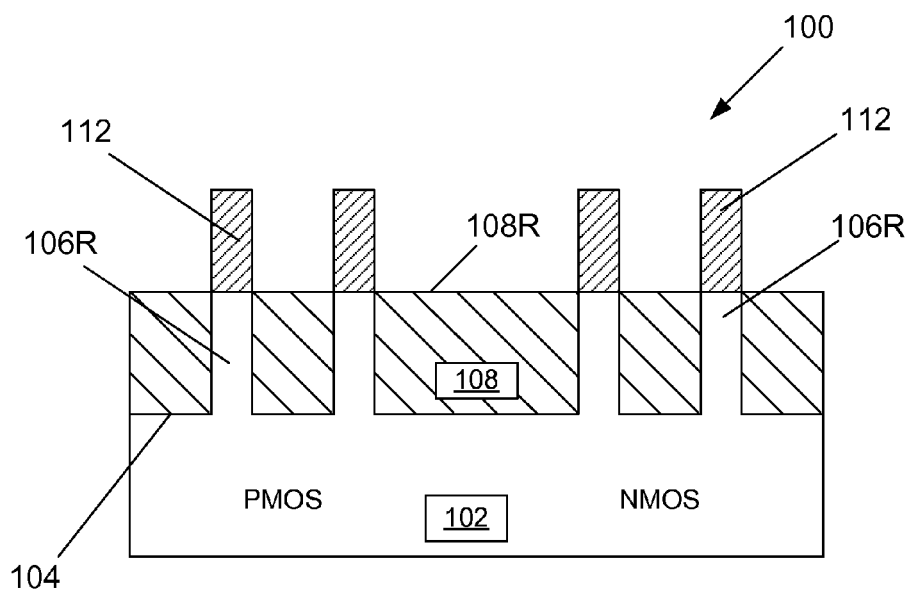

FIG. 2F depicts the product 100 after the layer of insulating material 108 was recessed so as to expose all or a portion of the semiconductor material 112 above the recessed upper surface 108R of the layer of insulating material 108.

Figure 2G:
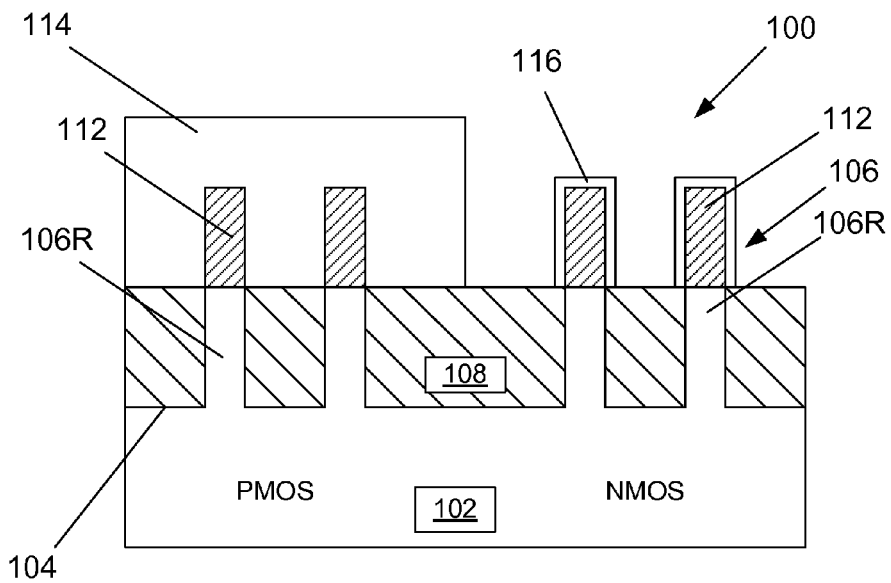

FIG. 2G depicts the product 100 after several process operations were performed. First, a masking layer 114, such as a patterned hard mask layer, was formed so as to cover the PMOS region and expose the NMOS region for further processing. Then, a timed epitaxial growth process was performed through the patterned masking layer 114 to form a layer of semiconductor material cladding 116 on the fins 106 for the NMOS device. In one illustrative embodiment, the semiconductor material cladding 116 may have a thickness of about 1-6 nm. The semiconductor material cladding 116 may be made of a semiconductor material that is different than that of the semiconductor material 112. In one illustrative embodiment, where the semiconductor material 112 is comprised of silicon-germanium ($Si_{0.75}Ge_{0.25}$ or $Si_{0.50}Ge_{0.5}$), the semiconductor material cladding 116 may be a layer of silicon. In another example, the semiconductor material 112 may be a SiGe material and the semiconductor material cladding 116 may be a SiGe material with a higher amount of germanium than is present in the SiGe semiconductor material 112. If desired, the semiconductor material cladding 116 may be formed with a tensile stress to enhance the performance of the NMOS device. As will be appreciated by those skilled in the art after a complete reading of the present application, the semiconductor material cladding 116 will be the primary region where the channel will form for the NMOS device during operation. As should be clear from the forgoing, in some embodiments, the semiconductor material of the substrate 102 and the semiconductor material cladding 116 may be made of the same semiconductor material, e.g., they both may be made of silicon. In other embodiments, the semiconductor material of the substrate 102, the semiconductor material 112 and the semiconductor material cladding 116 may each be made of different semiconductor materials.

Figure 2H:
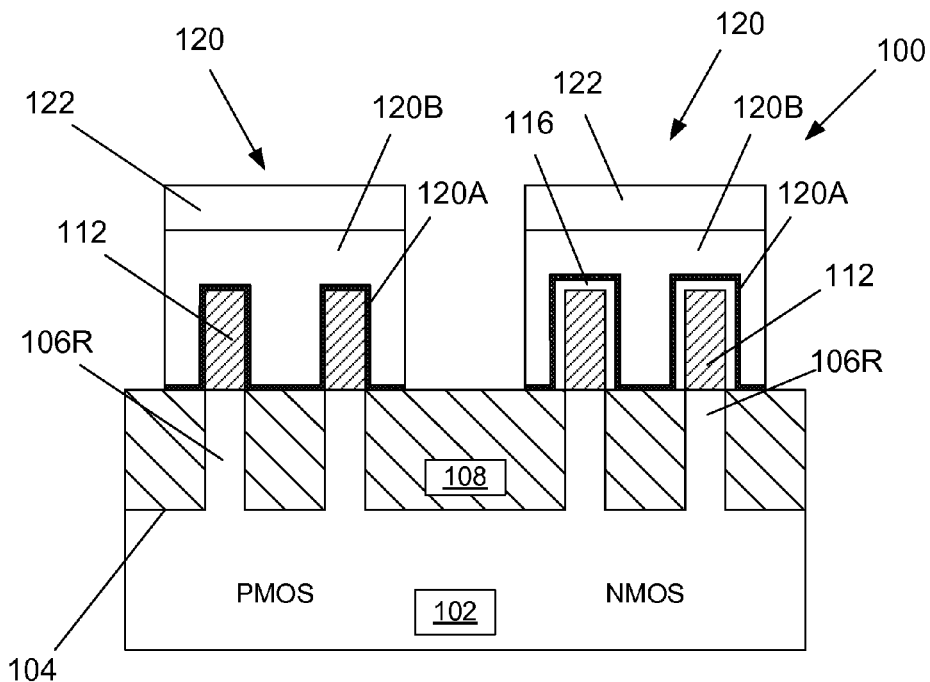

At the point of processing depicted in FIG. 2G, the masking layer 114 may be removed and the illustrative FinFET-based CMOS product 100 may be completed using traditional fabrication techniques. For example, FIG. 2H depicts the product, after illustrative and representative gate structures 120 and gate cap layers 122 were formed for the NMOS and PMOS devices. Of course, the materials of construction for the gate structures of the NMOS and PMOS devices may be (and likely will be) different for the two different types of devices. In one illustrative embodiment, the schematically depicted gate structures 120 include an illustrative gate insulation layer 120A and an illustrative gate electrode 120B. The gate insulation layer 120A may be comprised of a variety of different materials, such as, for example, silicon dioxide, a so-called high-k (k greater than 10) insulation material (where k is the relative dielectric constant), etc. Similarly, the gate electrode 120B may also be of a material such as polysilicon or amorphous silicon, or it may be comprised of one or more metal layers that act as the gate electrode 120B. As will be recognized by those skilled in the art after a complete reading of the present application, the gate structures 120 of the product 100 depicted in the drawings, i.e., the gate insulation layer 120A and the gate electrode 120B, are intended to be representative in nature. That is, the gate structures 120 may be comprised of a variety of different materials and they may have a variety of configurations. The gate structures 120 may be manufactured using either the so-called "gate-first" or "replacement gate" techniques.

FIGS. 3A-3I depict yet other illustrative novel methods disclosed herein for forming PMOS FinFET devices and multiple NMOS FinFET devices with different structural configurations and different performance characteristics on CMOS based integrated circuit products. In this embodiment, the CMOS based integrated circuit product 100 comprises both NMOS and PMOS transistors, but there are two different variations or types of NMOS devices. The selected NMOS FinFET device has a different physical configuration as compared to the other type of NMOS device so to as to enhance the performance capabilities of selected, performance-enhanced NMOS devices as compared to the other type of NMOS device. As used below, one of the NMOS devices will be referred to as a regular or standard NMOS device (with the designation NMOSR), whereas the performance-enhanced type of NMOS device will be referred to with the designation NMOSPE. As will be appreciated by those skilled in the art after a complete reading of the present application, the PMOS device and the two different types of NMOS devices may be formed at various locations across the substrate 102, i.e., they need not be formed laterally adjacent to one another, although that configuration may be employed in some applications. In the drawings that follow, each of the three devices will be depicted as being comprised of a single fin. However, in practice, each of the devices may comprise any number of fins and each of the devices need not have the same number of fins, although such a configuration may be employed in some applications.

Figure 3A:
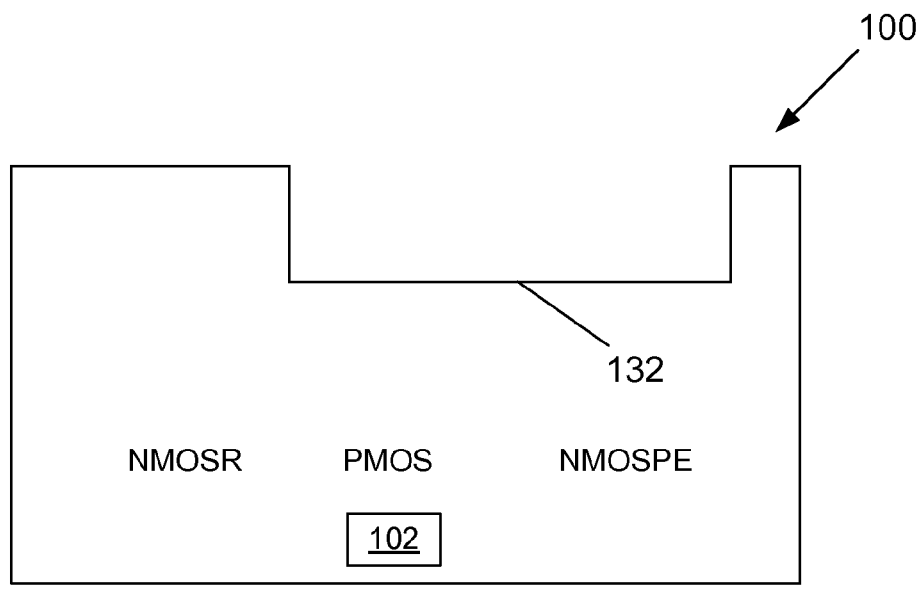
FIGS. 3A-3I depict yet other illustrative novel methods disclosed herein for forming PMOS FinFET devices and multiple NMOS FinFET devices with different structural configurations and different performance characteristics.

FIG. 3A depicts the product 100 after a trench 132 was formed in the substrate 102 by performing an etching process through a patterned etch mask (not shown). In this embodiment, semiconductor material 134 (described below) that will be used for the fins for both the PMOS device and the performance-enhanced NMOSPE device will be formed in the trench 132. The depth and width of the trench 132 may vary depending upon the particular application and the number of fins for each of the PMOS device and the performance-enhanced NMOSPE device.

Figure 3B:
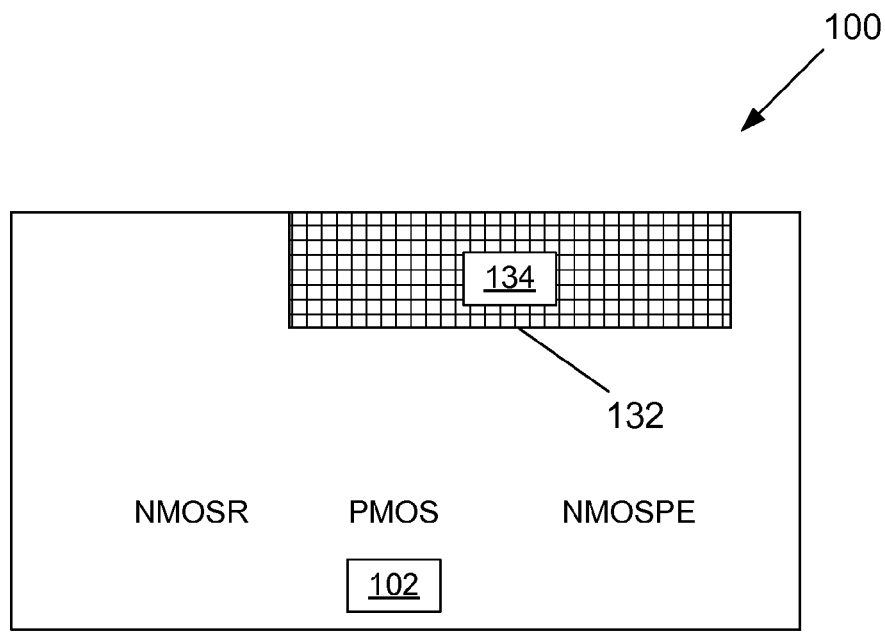
Figure 3C:
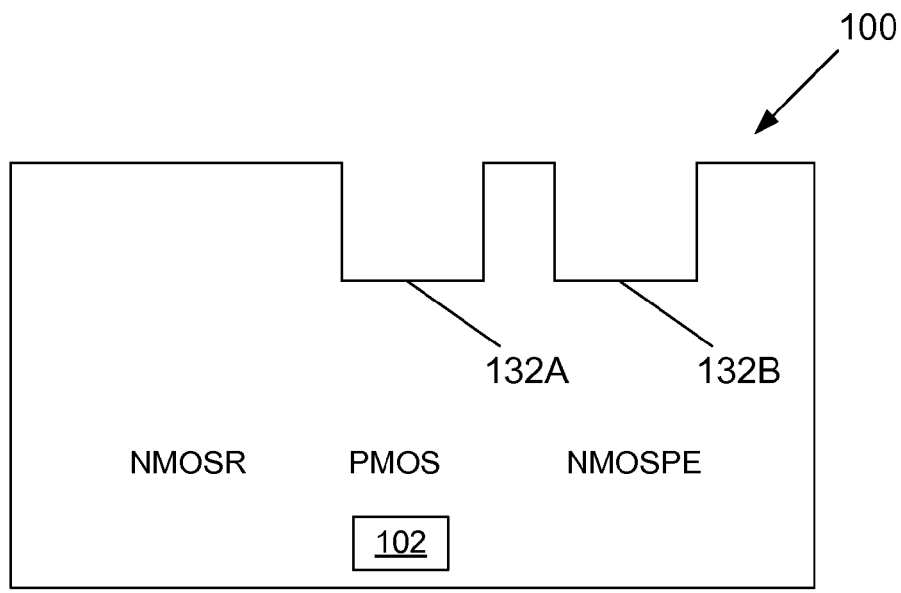
Figure 3D:
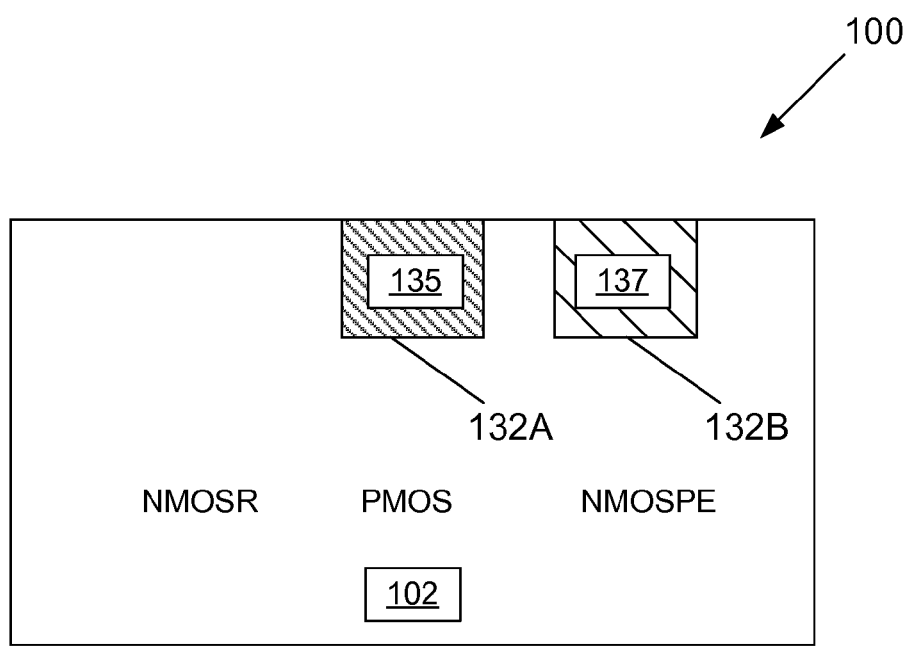

FIG. 3B depicts the product 100 after a fully-strained, substantially defect-free semiconductor material 134 was formed in the trench 132 for both the PMOS device and the performance-enhanced NMOSPE device. The semiconductor material 134 may be comprised of a semiconductor material that is different from that of the semiconductor material of the substrate 102. For example, if the substrate 102 is made of silicon, the semiconductor material 134 may be made of silicon germanium ($Si_{(1-x)}Ge_x$ where "x" ranges from 0.1-1), such as $Si_{0.75}Ge_{0.25}$ or $Si_{0.50}Ge_{0.5}$, substantially pure germanium, a III-V material, etc. The semiconductor material 134 may be formed by performing an epitaxial growth process and it may have a thickness that corresponds approximately to the depth of the trench 132. As will be appreciated by those skilled in the art after a complete reading of the present application, the semiconductor material 134 will become the channel semiconductor material for the PMOS device Of course, the single trench 132 depicted in FIG. 3A is but one example of a process flow that may be performed using the methods disclosed herein. That is, in practice, the semiconductor material(s) for the fins of the PMOS device and the performance-enhanced NMOSPE device may be formed in separate, laterally spaced apart trenches that are formed at various locations across the substrate 102 in an alternative process flow that is depicted in FIGS. 3C-3D. In this alternative flow, two physically separated trenches 132A, 132B are defined in the substrate 102. Of course, as noted above, if desired, the two physically separated trenches 132A, 132B may be filled with the same semiconductor material, e.g., the material 134, for both the PMOS device and the performance-enhanced NMOSPE device. However, in one alternative process flow, different semiconductor materials 135, 137 will be formed in the trenches 132A, 132B for the PMOS device and the performance-enhanced NMOSPE device, respectively. In general, each of the semiconductor materials 135, 137 is a different semiconductor material than the semiconductor material of the substrate 102. For example, in one illustrative embodiment, the semiconductor material 135 may be a fully-strained substantially pure germanium material that is formed with a compressive stress, while the semiconductor material 137 may be comprised of silicon-germanium (e.g., $Si_{0.75}Ge_{0.25}$ or $Si_{0.50}Ge_{0.5}$). In one particular embodiment, where the substrate 102 is made of silicon, the fins for the regular or standard NMOSR device, the PMOS device and the performance-enhanced NMOSPE device may be comprised of silicon, a substantially pure germanium material and silicon-germanium (e.g., $Si_{0.75}Ge_{0.25}$ or $Si_{0.50}Ge_{0.5}$), respectfully. In the case where the semiconductor materials 135, 137 are made of two different semiconductor materials, they may be formed by performing different epitaxial growth processes while masking one of the trenches 132A, 132B so as to fill the unmasked trench with the desired semiconductor material, e.g., 135 or 137. The manner in which such epi semiconductor materials are formed so as to have a compressive stress or a tensile stress are well known to those skilled in the art. In the drawings that follow, the embodiment shown in FIGS. 3A-3B will be depicted. Of course, the following process flow would be equally applicable to the alternative process flow depicted in FIGS. 3C-3D.

Figure 3E:
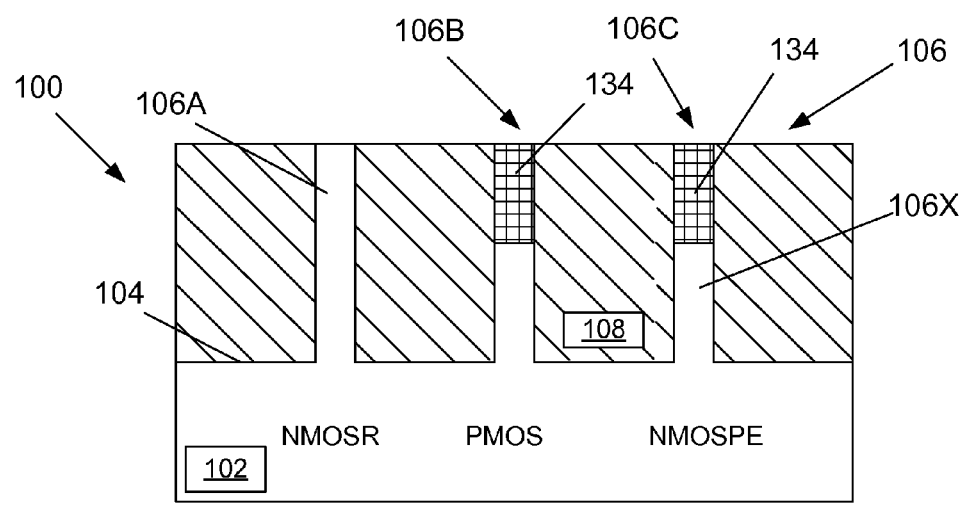

FIG. 3E depicts the product 100 after several process operations were performed. First, one or more etching processes, e.g., anisotropic etching processes, were performed through a patterned fin-formation etch mask (not shown) to form a plurality of fin-formation trenches 104 and thereby define a plurality of overall fin structures 106A-C (collectively referred to using the number 106). The fins 106A, 106B and 106C are, respectively, for the regular or standard NMOSR device, the PMOS device and the performance-enhanced NMOSPE device. As depicted, the fin 106A is comprised entirely of the substrate 102 semiconductor material, while, in this illustrative process flow, an upper portion of the fins 106B, 106C are comprised of the semiconductor material 134 and a lower substrate fin portion 106X. In the case of the alternative process flow discussed above in FIGS. 3C-3D, the fin 106B would be comprised of the semiconductor material 135, while the fin 106C would be comprised of the semiconductor material 137. Next, the above-described layer of insulating material 108 (e.g., silicon dioxide) was deposited so as to overfill the fin-formation trenches 104 and a chemical mechanical polishing (CMP) process was performed to planarize the upper surface of the layer of insulating material 108 and thereby expose the upper surface of the fins 106.

Figure 3F:
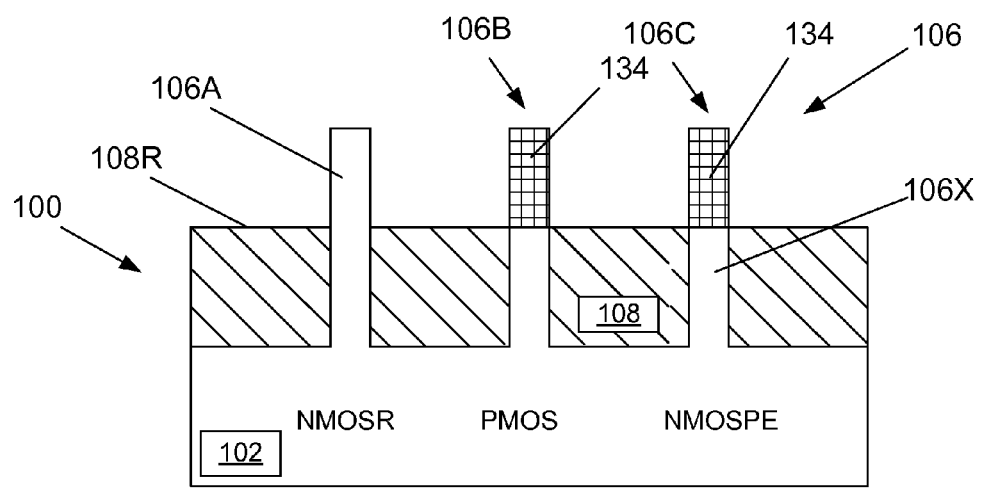

FIG. 3F depicts the product 100 after the layer of insulating material 108 was recessed so as to expose all or a portion of the semiconductor material 134 of the fins 106B, 106C above the recessed upper surface 108R of the layer of insulating material 108.

Figure 3G:
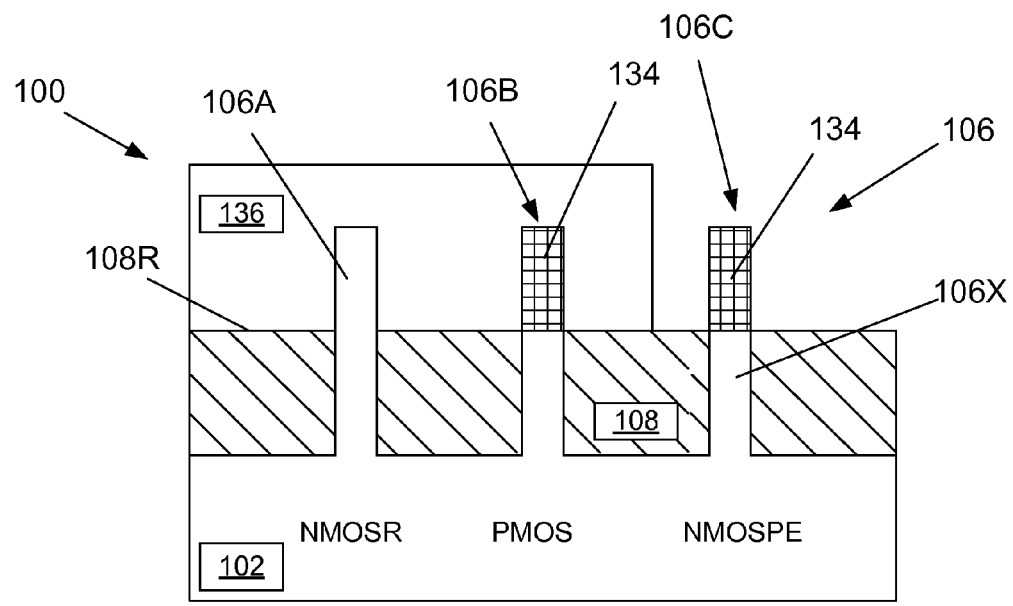

FIG. 3G depicts the product 100 after a masking layer 136, such as a patterned hard mask layer, was formed so as to cover the regular NMOSR device and the PMOS device while leaving the performance-enhanced NMOSPE device exposed for further processing.

Figure 3H:
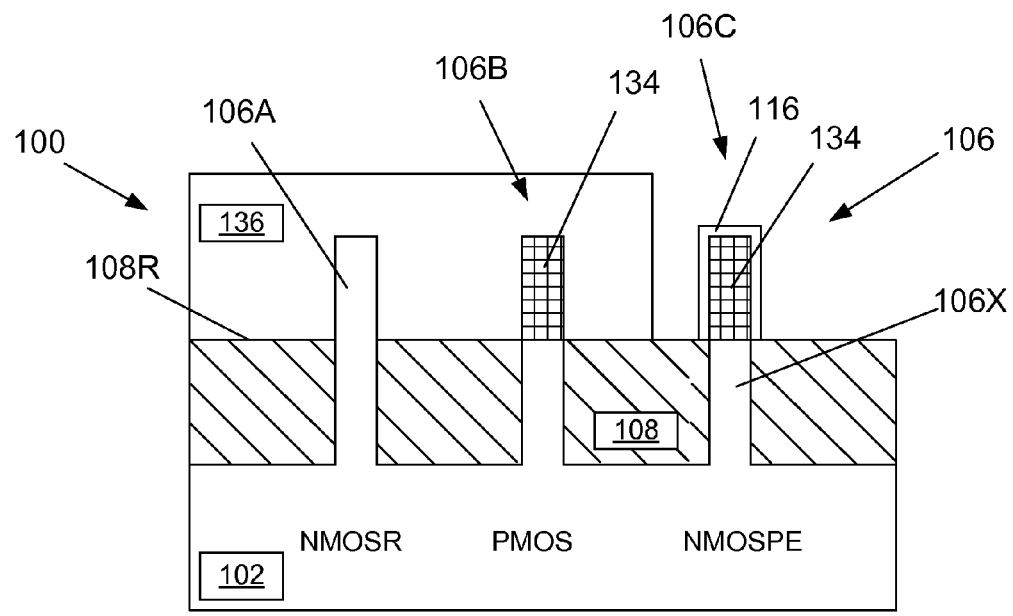

FIG. 3H depicts the product 100 after a timed, epitaxial growth process was performed through the patterned masking layer 136 to form the above-described layer of semiconductor material cladding 116 on the fin 106C for the performance-enhanced NMOSPE device. As will be appreciated by those skilled in the art after a complete reading of the present application, the semiconductor material cladding 116 will be the primary region where the channel will form for the performance-enhanced NMOS device during operation. The semiconductor material cladding 116 may be made of a semiconductor material that is different than that of the semiconductor material 134 (or different from that of the semiconductor material 137 in the alternative process flow described above). In one illustrative embodiment, where the semiconductor material 134 is comprised of silicon-germanium ($Si_{0.75}Ge_{0.25}$ or $Si_{0.50}Ge_{0.5}$), the semiconductor material cladding 116 may be a layer of silicon. If desired, the semiconductor material cladding 116 may be formed with a tensile stress to enhance the performance of the performance-enhanced NMOSPE device. As should be clear from the forgoing, in some embodiments, the semiconductor material of the substrate 102 and the semiconductor material cladding 116 may be made of the same semiconductor material, e.g., they both may be made of silicon. In other embodiments, the semiconductor material of the substrate 102, the semiconductor material 134 (and 135, 137 if they are present) and the semiconductor material cladding 116 may each be made of different semiconductor materials.

Forming the semiconductor material cladding 116 on the performance-enhanced NMOSPE device may increase its performance (e.g., the performance-enhanced NMOSPE device may exhibit greater drive current capabilities as well as other device characteristics relative to a regular or standard NMOSR device. Typically, the regular NMOSR device comprises a relaxed semiconductor material which tends to reduce its performance capabilities. The cladding 116 on the NMOSPE device is a strained material that should enhance the performance characteristics of the NMOSPE device relative to a regular NMOSR device. In addition, the clad NMOSPE device is a quantized device (it is a quantum well region) which will also help the performance of the NMOSPE device. These devices constitute a 2D electron gas system and the performance of the devices would be superior as compared to devices made from regular bulk materials, e.g., higher drive currents at lower voltage, lower leakage at the corresponding voltage, etc. Producing a CMOS based integrated circuit product 100 with the two different "grades" of NMOS devices provides device designers with greater flexibility when designing CMOS based integrated circuit products manufactured using FinFET devices. In a typical integrated circuit product, there are needs for devices with different operational characteristics, e.g., high-performance, high-power devices; low-performance, low-power devices, etc., that have different threshold voltages. The methods and devices disclosed herein provide product designers more design flexibility by providing NMOSR, NMOSPE and PMOS devices which have different performance characteristics, thereby enabling the product designer to more precisely design the desired integrated circuit product such that it meets all performance specifications established for the IC product.

Figure 3I:
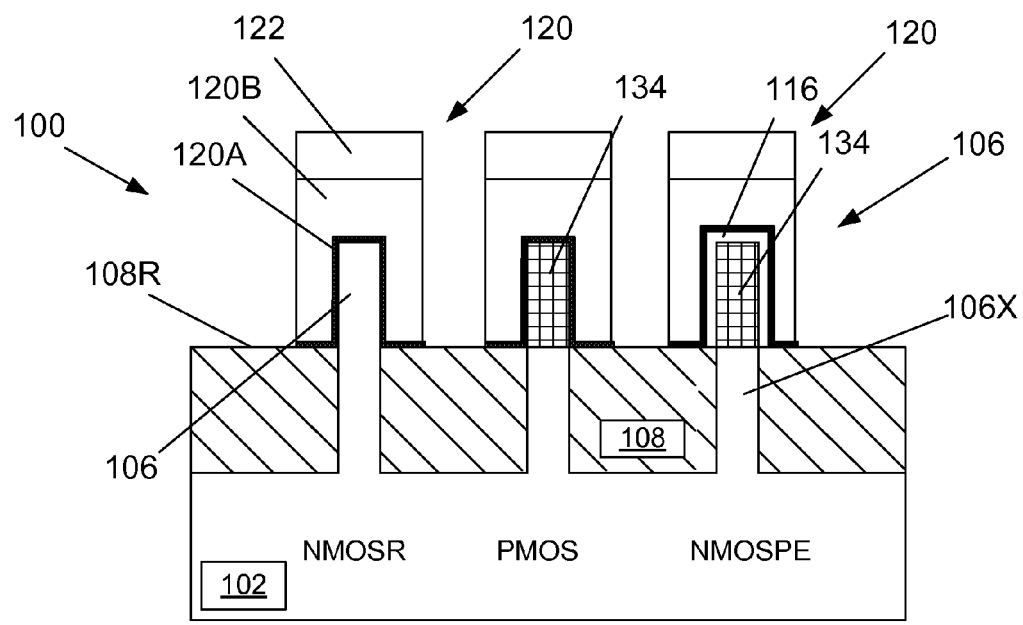

At the point of processing depicted in FIG. 3H, the masking layer 136 may be removed and the illustrative FinFET-based CMOS product 100 may be completed using traditional fabrication techniques. For example, FIG. 3I depicts the product 100 after the above-described illustrative and representative gate structures 120 and gate cap layers 122 were formed for the regular NMOSR device, the PMOS device and the performance-enhanced NMOSPE device. Of course, the materials of construction for the gate structures of the NMOS and PMOS devices may be (and likely will be) different, i.e., different work function metals are used for the NMOS and PMOS devices.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed is:

1. A method of forming a first NMOS FinFET device, a PMOS FinFET device and a second NMOS FinFET device for a CMOS integrated circuit product formed on a semiconductor substrate made of a first semiconductor material, the method comprising:

forming first, second and third fins for said first NMOS FinFET device, said PMOS FinFET device and said second NMOS FinFET device, respectively, wherein said first fin consists entirely of said first semiconductor material, said second fin comprising a lower substrate fin portion made of said first semiconductor material and an upper fin portion made of a second semiconductor material, said third fin comprising a lower substrate fin portion made of said first semiconductor material and an upper fin portion made of a third semiconductor material that is positioned above said lower substrate fin portion of said third fin, wherein said second semiconductor material and said third semiconductor material are each different from said first semiconductor material, and wherein said second semiconductor material is different from said third semiconductor material;

performing at least one process operation to form a recessed layer of insulating material adjacent said first, second and third fins, said recessed layer of insulating material comprising a recessed upper surface that exposes at least a portion of said first fin and at least a portion of said upper fin portion of both of said second and third fins;

forming a first patterned masking layer that covers said first NMOS FinFET device and said PMOS FinFET device and exposes said second NMOS FinFET device;

with said first patterned masking layer in position, performing an epitaxial deposition process to form a semiconductor material cladding on said exposed upper portion of said third fin for said second NMOS FinFET device, wherein said semiconductor material cladding is a different semiconductor material than that of said third semiconductor material;

forming a PMOS gate structure for said PMOS FinFET device around said exposed upper portion of said second fin of said PMOS device; and forming a first NMOS gate structure for said first NMOS FinFET device around said exposed portion of said first fin and a second NMOS gate structure for said second NMOS FinFET device around said semiconductor material cladding.

2. The method of claim 1, wherein said second semiconductor material is made of substantially pure germanium and said third semiconductor material comprises silicon-germanium ($Si_{(1-x)}Ge_x$ where "x" ranges from 0.1-1).

3. The method of claim 1, wherein said second semiconductor material is formed with a compressive stress.

4. The method of claim 3, wherein said semiconductor material cladding is formed with a tensile stress.

5. The method of claim 1, wherein said third semiconductor material is formed with a tensile stress.

6. The method of claim 5, wherein said semiconductor material cladding is formed with a tensile stress.

7. The method of claim 1, wherein performing said epitaxial deposition process to form said semiconductor material cladding comprises performing said epitaxial deposition process to form a conformal layer of said semiconductor material cladding having a substantially uniform thickness on said exposed upper portion of said third fin for said second NMOS device.

8. The method of claim 1, wherein said step of forming said first, second and third fins comprises:

forming separate, laterally spaced apart first and second trenches in said semiconductor substrate, said first trench being located in an area of said semiconductor substrate where said second fin will be formed, said second trench being located in an area of said semiconductor substrate where said third fin will be formed;

while masking an area above said second trench, filling said first trench with said second semiconductor material;

after filling said first trench, filling said second trench with said third semiconductor material;

forming a patterned fin-formation etch mask above said semiconductor substrate and said second and third semiconductor materials, and performing at least one etching process though said patterned fin-formation etch mask to thereby define said first, second and third fins.

9. A method of forming a first NMOS FinFET device in a first NMOS region, a PMOS FinFET device in a PMOS region, and a second NMOS FinFET device in a second NMOS region for a CMOS integrated circuit product that is formed on a semiconductor substrate made of a first semiconductor material, the method comprising:

forming first, second and third fins for said first NMOS FinFET device, said PMOS FinFET device and said second NMOS FinFET device, respectively, wherein said first fin is formed in said first NMOS region and consists entirely of said first semiconductor material, wherein said second fin is formed in said PMOS region, and wherein said third fin is formed in said second NMOS region, both of said second and third fins comprising a lower substrate fin portion made of said first semiconductor material and an upper fin portion that is positioned above said lower substrate fin portion and is made of a second semiconductor material that is different from said first semiconductor material, wherein forming said first, second, and third fins comprises:

prior to forming any portions of said first, second and third fins, forming a single trench in said semiconductor substrate and filling said single trench with said second semiconductor material, said single trench extending from said PMOS region to said second NMOS region;

forming a patterned fin-formation etch mask above said semiconductor substrate and said filled single trench, said patterned fin-formation etch mask defining a position of said first fin above said first semiconductor material in said first NMOS region, a position of said second fin above said second semiconductor material in said PMOS region, and a position of said third fin above said second semiconductor material in said second NMOS region; and performing at least one etching process though said patterned fin-formation etch mask to thereby define said first, second and third fins;

performing at least one process operation to form a recessed layer of insulating material adjacent said first, second and third fins, said recessed layer of insulating material comprising a recessed upper surface that exposes at least a portion of said first fin and at least a portion of said upper fin portion of both of said second and third fins;

forming a first patterned masking layer that covers said first NMOS FinFET device and said PMOS FinFET device and exposes said second NMOS FinFET device;

with said first patterned masking layer in position, performing an epitaxial deposition process to form a semiconductor material cladding on said exposed upper portion of said third fin for said second NMOS FinFET device, wherein said semiconductor material cladding is a different semiconductor material than that of said second semiconductor material;

forming a PMOS gate structure for said PMOS FinFET device around said exposed upper portion of said second fin of said PMOS device; and forming a first NMOS gate structure for said first NMOS FinFET device around said exposed portion of said first fin and a second NMOS gate structure for said second NMOS FinFET device around said semiconductor material cladding.

10. The method of claim 9, wherein said first semiconductor material is silicon, said second semiconductor material comprises silicon-germanium ($Si_{(1-x)}Ge_x$ where "x" ranges from 0.1-1), substantially pure germanium, or a III-V material and said semiconductor material cladding comprises ($Si_{(1-x)}Ge_x$ where "x" ranges from 0.1-1) or silicon.

11. The method of claim 9, wherein said first semiconductor material is silicon, said second semiconductor material comprises silicon-germanium ($Si_{(1-x)}Ge_x$ where "x" ranges from 0.1-1), and said semiconductor material cladding is silicon.

12. The method of claim 9, wherein said second semiconductor material is formed with a compressive stress.

13. The method of claim 12, wherein said semiconductor material cladding is formed with a tensile stress.

14. The method of claim 9, wherein said first semiconductor material and said semiconductor material cladding are made of a same semiconductor material.

15. The method of claim 9, wherein said first semiconductor material, said second semiconductor material and said semiconductor material cladding are each different semiconductor materials.

16. The method of claim 9, wherein performing said epitaxial deposition process to form said semiconductor material cladding comprises performing said epitaxial deposition process to form a conformal layer of said semiconductor material cladding having a substantially uniform thickness on said exposed upper portion of said second fin for said second NMOS device.

17. A method of forming a first NMOS FinFET device in a first NMOS region, a PMOS FinFET device in a PMOS region, and a second NMOS FinFET device in a second NMOS region for a CMOS integrated circuit product that is formed on a semiconductor substrate made of a first semiconductor material, the method comprising:

forming first, second and third fins for said first NMOS FinFET device, said PMOS FinFET device and said second NMOS FinFET device, respectively, wherein said first fin is formed in said first NMOS region and consists entirely of said first semiconductor material, wherein said second fin is formed in said PMOS region, and wherein said third fin is formed in said second NMOS region, both of said second and third fins comprising a lower substrate fin portion made of said first semiconductor material and an upper fin portion that is positioned above said lower substrate fin portion and is made of a second semiconductor material that is different from said first semiconductor material, wherein forming said first, second and third fins comprises:

prior to forming any portions of said first, second and third fins, forming a first trench in said PMOS region and a second trench in said second NMOS region and filling said first and second trenches with said second semiconductor material, wherein said first trench in said PMOS region is separate and laterally spaced apart from said second trench in said second NMOS region;

forming a patterned fin-formation etch mask above said semiconductor substrate and said filled first and second trenches, said patterned fin-formation etch mask defining a position of said first fin above said first semiconductor material in said first NMOS region, a position of said second fin above said second semiconductor material in said PMOS region, and a position of said third fin above said second semiconductor material in said second NMOS region; and performing at least one etching process though said patterned fin-formation etch mask to thereby define said first, second and third fins;

performing at least one process operation to form a recessed layer of insulating material adjacent said first, second and third fins, said recessed layer of insulating material comprising a recessed upper surface that exposes at least a portion of said first fin and at least a portion of said upper fin portion of both of said second and third fins;

forming a first patterned masking layer that covers said first NMOS FinFET device and said PMOS FinFET device and exposes said second NMOS FinFET device;

with said first patterned masking layer in position, performing an epitaxial deposition process to form a semiconductor material cladding on said exposed upper portion of said third fin for said second NMOS FinFET device, wherein said semiconductor material cladding is a different semiconductor material than that of said second semiconductor material;

forming a PMOS gate structure for said PMOS FinFET device around said exposed upper portion of said second fin of said PMOS device; and forming a first NMOS gate structure for said first NMOS FinFET device around said exposed portion of said first fin and a second NMOS gate structure for said second NMOS FinFET device around said semiconductor material cladding.

18. The method of claim 17, wherein said first semiconductor material is silicon, said second semiconductor material comprises silicon-germanium ($Si_{(1-x)}Ge_x$ where "x" ranges from 0.1-1), substantially pure germanium, or a III-V material and said semiconductor material cladding comprises ($Si_{(1-x)}Ge_x$ where "x" ranges from 0.1-1) or silicon.

19. The method of claim 17, wherein said first semiconductor material is silicon, said second semiconductor material comprises silicon-germanium ($Si_{(1-x)}Ge_x$ where "x" ranges from 0.1-1), and said semiconductor material cladding is silicon.

20. The method of claim 17, wherein said second semiconductor material is formed with a compressive stress.

21. The method of claim 20, wherein said semiconductor material cladding is formed with a tensile stress.

22. The method of claim 17, wherein said first semiconductor material and said semiconductor material cladding are made of a same semiconductor material.

23. The method of claim 17, wherein said first semiconductor material, said second semiconductor material and said semiconductor material cladding are each different semiconductor materials.

24. The method of claim 17, wherein performing said epitaxial deposition process to form said semiconductor material cladding comprises performing said epitaxial deposition process to form a conformal layer of said semiconductor material cladding having a substantially uniform thickness on said exposed upper portion of said second fin for said second NMOS device.

* * * * *